(12) United States Patent
Chu

(10) Patent No.: US 10,595,427 B2
(45) Date of Patent: Mar. 17, 2020

(54) ADDITIONAL FUNCTION DEVICE OF EXTERNAL POWER SUPPLY MODULE

(71) Applicant: FSP TECHNOLOGY INC., Taoyuan (TW)

(72) Inventor: Ting-Chuan Chu, Taoyuan (TW)

(73) Assignee: FSP TECHNOLOGY INC., Taoyuan (TW)

( * ) Notice: Subject to any disclaimer, the term of this patent is extended or adjusted under 35 U.S.C. 154(b) by 0 days.

(21) Appl. No.: 16/041,933

(22) Filed: Jul. 23, 2018

(65) Prior Publication Data

US 2019/0075672 A1 Mar. 7, 2019

(30) Foreign Application Priority Data

Sep. 1, 2017 (TW) .............................. 106130056 A

(51) Int. Cl.
| | | |
|---|---|---|
| *H05K 7/02* | (2006.01) | |
| *G06F 1/26* | (2006.01) | |
| *H01R 13/621* | (2006.01) | |
| *H02M 3/00* | (2006.01) | |
| *H01R 31/06* | (2006.01) | |
| *H01R 13/512* | (2006.01) | |
| *H01R 27/02* | (2006.01) | |
| *H05K 7/10* | (2006.01) | |

(52) U.S. Cl.
CPC ............ *H05K 7/026* (2013.01); *G06F 1/263* (2013.01); *G06F 1/266* (2013.01); *H01R 13/512* (2013.01); *H01R 13/621* (2013.01); *H01R 27/02* (2013.01); *H01R 31/06* (2013.01); *H02M 3/00* (2013.01); *H05K 7/10* (2013.01)

(58) Field of Classification Search
CPC .. H02M 1/10; H02M 7/003; H02M 2001/007; H02M 3/00; G06F 1/263; G06F 1/266; G06F 1/16; H01R 31/06; H01R 27/02; H01R 13/512; H01R 13/621; H05K 7/026; H05K 7/10
See application file for complete search history.

(56) References Cited

U.S. PATENT DOCUMENTS

| 4,579,410 | A  | * | 4/1986 | Soloman ................ | H01R 31/06 439/133 |
|---|---|---|---|---|---|
| 2008/0137386 | A1 | * | 6/2008 | Jitaru ..................... | G06F 1/263 363/146 |
| 2008/0211310 | A1 | * | 9/2008 | Jitaru .................... | H01R 31/065 307/72 |
| 2009/0310384 | A1 | * | 12/2009 | Sharifipour ............ | H02M 1/10 363/13 |

* cited by examiner

*Primary Examiner* — James Wu
(74) *Attorney, Agent, or Firm* — WPAT, PC

(57) ABSTRACT

An additional function device of an external power supply module includes a converter and a connecting line. With an input port configured at the converter in the additional function device, detachable assembly and connection to a power core unit can be achieved, and a plurality of power core units can be further assembled and connected to achieve a composite or redundant power output. Thus, the additional function device of an external power supply module is provided with diversified matching capabilities, enabling the additional function device of the external power supply module to be effectively utilized and reducing resource waste.

18 Claims, 6 Drawing Sheets

ADDITIONAL FUNCTION DEVICE OF EXTERNAL POWER SUPPLY MODULE

BACKGROUND OF THE INVENTION

Field of the Invention

The invention relates to improvement of an adapter, and more particularly to an additional function device of an external power supply module, wherein the additional function device is adapted to be detachably assembled and connected to a power core unit.

Description of the Prior Art

An adapter is a power supply device for a small-size portable device or certain electronic apparatuses, and is extensively applied to mainstream electronic products including laptop computers and small-size computer hosts. An adapter includes an adapter body for voltage transformation and current rectification, a first connecting conductive wire coupling an external power supply or mains electricity power supply to the adapter body, and a second connecting conductive wire coupling a load and the adapter body. As such, power acquired from the external power supply or mains electricity power supply undergoes voltage transformation and current rectification, and is then transmitted to a back-end load to provide the power needed by the load.

Current various adapters are built-in with a transformer having a constant output power (a constant wattage). When a load terminal is a product requiring different power specifications, an adapter needs to be re-designed and re-manufactured. In addition to having a single function, current adapters are frequently replaced along with changes in products, causing related issues such as resource waste.

SUMMARY OF THE INVENTION

It is an object of the present invention to provide an adapter having functional versatility.

It is another object of the present invention to provide an additional function device of an external power supply module, wherein the additional function device has diversified matching capabilities to further provide functional versatility.

It is yet another object of the present invention to provide an additional function device of an external power supply module, wherein the additional function device is capable of enhancing powering stability.

To achieve the above and other objects, the present invention provides an additional function device of an external power supply module. The additional function device includes a converter and a connecting line. The converter includes an input port for detachably assembly and connecting to a power core unit. The input port acquires a transmission power converted by the power core unit, and includes a plurality of connecting terminals corresponding to the power core unit having different parameters. The connecting line has one end thereof coupled to an output terminal of the converter to transmit the transmission power, and the other end thereof for connecting to a load to output the transmission power to the load.

In one embodiment of the present invention, the converter includes a DC-to-DC module. Further, the converter includes a USB connection port coupled to the DC-to-DC module.

In one embodiment of the present invention, the converter includes a USB connection port, which is used to couple the converter, after having been coupled to the power core unit, to the DC-to-DC module built-in the power core unit.

In one embodiment of the present invention, the converter includes thereon a power display light assembly for indicating when the power core unit provides power.

In one embodiment of the present invention, the other end of the connecting line includes a connection port terminal and a terminal portion. The connection port terminal and the terminal portions are fixedly connected by means of a fixing element. The fixing element may be a rivet or a screw.

In one embodiment of the present invention, the converter further includes another input port for assembling and connecting to another power core unit. Further, the converter includes a digital control module coupled to the load and the power core units. A powering parameter can be modulated and controlled through communication of the load and the power core units. The additional function device of the present invention may further include a housing combined with the converter. The housing is for receiving the power core units.

Accordingly, with the functional configuration in the converter of the additional function device, detachable assembly and connection to a power core unit can be achieved, and a plurality of power core units can be further assembled and connected to achieve a composite or redundant power output. Thus, the additional function device of the external power supply module is provided with diversified matching capabilities, enabling the additional function device of the external power supply module to be effectively utilized and reducing resource waste.

DETAILED DESCRIPTION OF THE EMBODIMENTS

To better understand the objects, features and effects of the present invention, embodiments are given with the accompanying drawings below to further describe details of the present invention.

Figure 1A:
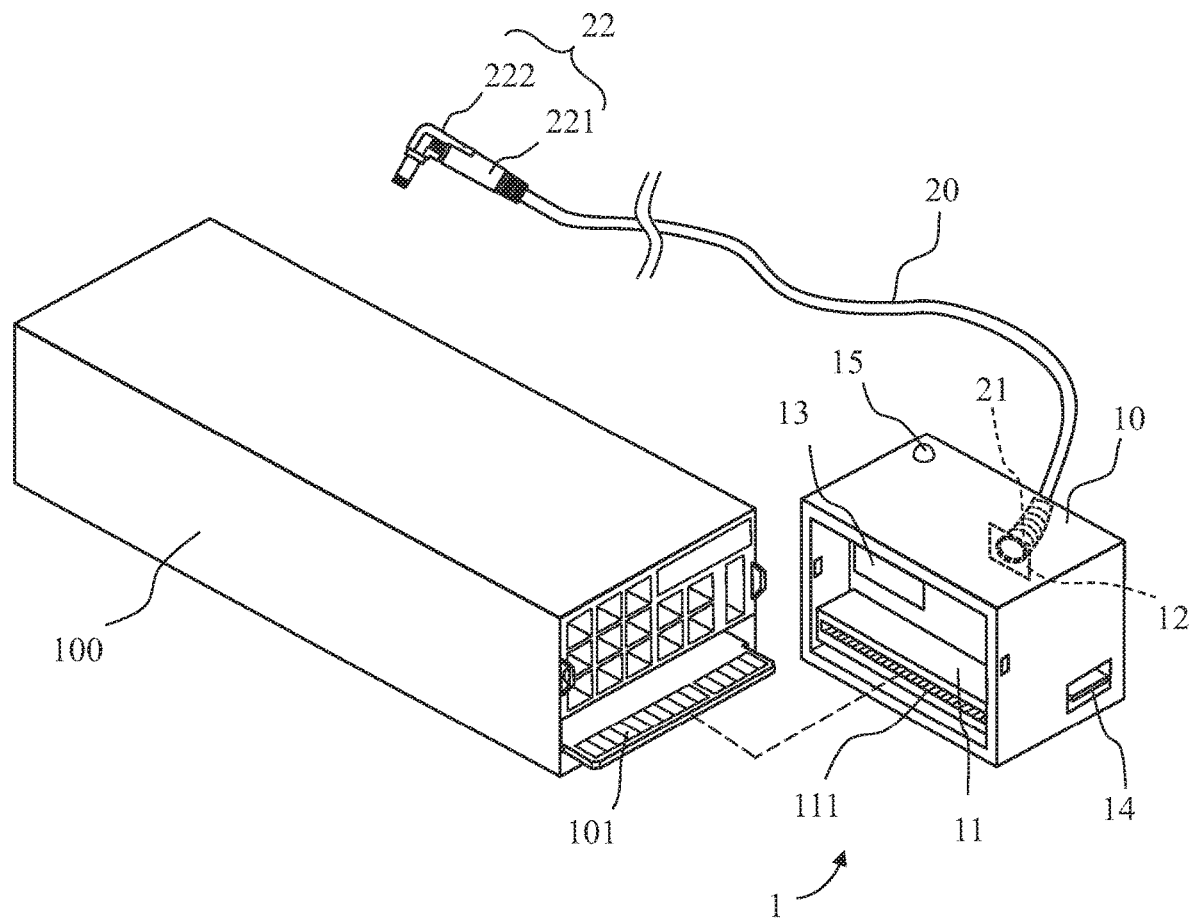
FIG. 1A shows a structural schematic diagram of an additional function device of an external power supply module according to an aspect of a first embodiment of the present invention.

FIG. 1A shows a structural schematic diagram of an additional function device of an external power supply module according to an aspect of a first embodiment of the present invention. An additional function device 1 of an external power supply module disclosed by the first embodiment of the present invention primarily includes a converter 10 and a connecting line 20.

The converter 10 includes an input port 11 for detachably assembling and connecting to a power core unit 100. The input port 11 acquires a transmission power converted by the power core unit 100, and includes a plurality of connection terminals 111 corresponding to the power core unit 100 having different parameters. The power core unit 100 is assembled and connected to the converter 10 by means of, for example, fastening or engaging. Any other detachable assembly means providing a fixing effect after the assembly and connection is also applicable.

The connecting line 20 has its one end 21 coupled to an output terminal 12 of the converter 10 to transmit the transmission power, and its other end 22 for connecting to a load to output the transmission power to the load. Further, the power core unit 100 is provided thereon a connection port (referring to FIG. 4), which is for coupling to a power line to acquire power from an external power supply or mains electricity power supply.

In the converter 10 of the aspect of the embodiment in FIG. 1A, the input port 11 includes the plurality of connection terminals 111 corresponding to the power core unit 100 having different parameters. For example, an application combination of the connection terminals 111 corresponds to the power core unit 100 having different output powers (different parameters); that is, the wattages provided by the power core unit 100 from different power supplies correspondingly use terminals 101 of different channels on the input port 11. Accordingly, when the power core units 100 are assembled and connected to the converter 10, the terminals 101 of the power core units 100 can respectively couple to the connection terminals 111 of the corresponding channels. With the above coupling relationship, the wattage provided by a power supply coupled to the power core unit 100 can be quickly determined at low costs.

By designing the plurality of connection terminals 111 of the power core unit 100 corresponding to different parameters to be detachably assembled and connected to the input port 11 of the power core unit 100, the additional function device 1 according to the embodiment of the present invention can be applied to a broader range. Thus, a user needs to only provide one additional function device 1, and application requirements with respect to different wattages of various power supplies can be satisfied.

In the first embodiment of the present invention, the converter 10 includes a DC-to-DC module 13, which converts a high-voltage DC current outputted from the power core unit 100 to a DC output power in a rated voltage and current. The DC-to-DC module 13 may be, for example but not limited to, a forward converter or a flyback converter, and the power core unit 100 may include an electromagnetic interference (EMI) filter circuit and an AC-to-DC circuit.

As shown in FIG. 1A, the converter 10 includes a USB connection port 14 coupled to the DC-to-DC module 13. The USB connection port 14 is for coupling to other external electronic devices (e.g., cell phones, tablet computers, cameras and power banks) to provide DC power. In addition to outputting power to the load, the additional function device 1 of the embodiment may further serve as a power source for other external electronic devices, achieving a multi-purpose object.

In this embodiment, the converter 10 may further include a power display light assembly 15. The power display light assembly 15 is an indication by means of display when the power core unit 100 provides power. The power display light assembly 15 may be one or more LED lamps, and issues corresponding indication light signals when the power core unit 100 normally provides power or malfunctions.

Figure 1B:
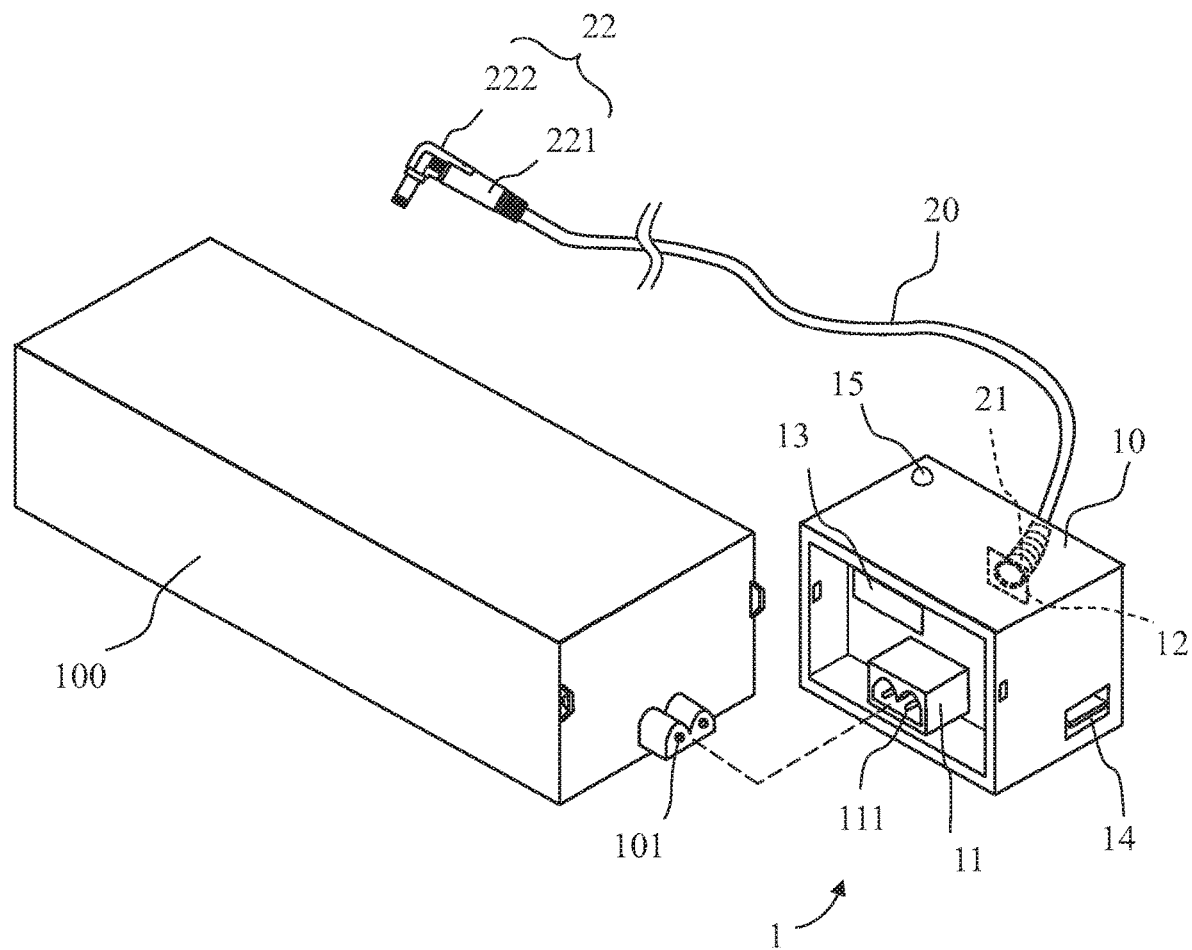
FIG. 1B shows a structural schematic diagram of an additional function device of an external power supply module according to another aspect of the first embodiment of the present invention.

FIG. 1B shows a structural schematic diagram of an additional function device of an external power supply module according to another aspect of the first embodiment of the present invention. The aspect differs from that of the first embodiment of the present invention shown in FIG. 1A by electrical connection methods between the converter 10 and the power core unit 100: (1) the form of the input port 11 on the converter 10; and (2) the form of the terminals 101 on the power core unit 100. In the aspect in FIG. 1(B), the input port 11 and the terminals 101 form a mutually docked male/female connector group. For example, the input port 11 on the converter 10 are in form of a two-terminal female connector and includes two connection terminals 111, and the terminals 101 on the power core unit 100 are in form of a two-terminal male connector.

Figure 2:
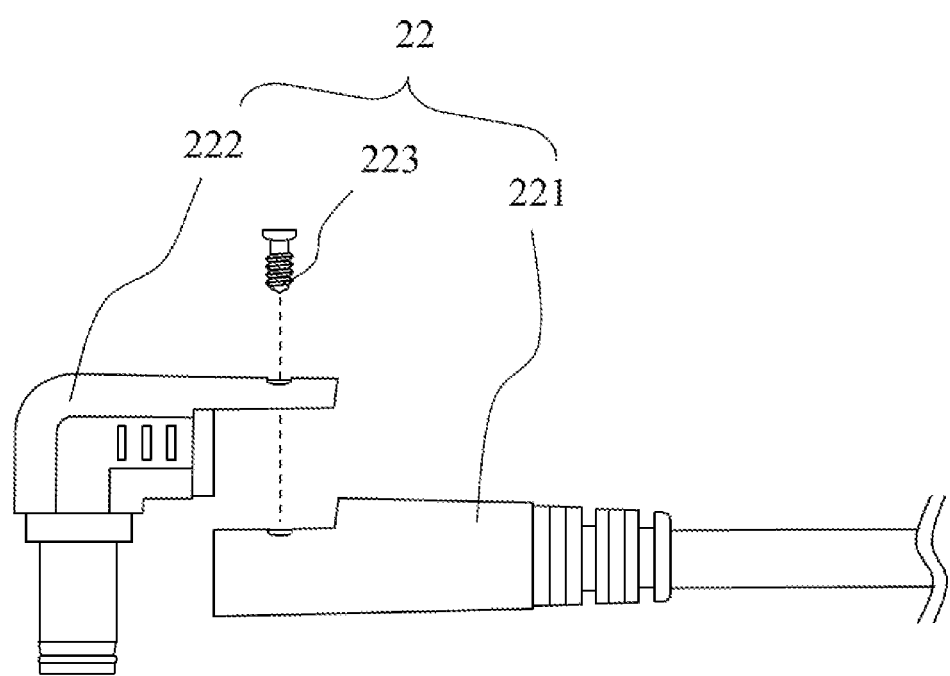
FIG. 2 shows a connection schematic diagram of the other end of the connecting line of the first embodiment of the present invention.

FIG. 2 shows a connection schematic diagram of the other end of the connecting line of the first embodiment of the present invention. In this embodiment, the other end 22 of the connecting line 20 includes a connection port terminal 221 and a terminal portion 222. The connection port terminal 221 and the terminal portion 222 are fixedly connected by a fixing element 223. For example, between the connection port terminal 221 and the terminal portion 222 may be a detachable insertion combination relationship, and the connection port terminal 221 and the terminal portion 222 may be insertedly connected to each other and then fixedly connected by the fixing element 223. As such, the terminal portion 222 may be replaced, and the connection port terminal 221 is enabled, through the above detachable insertion combination relationship, to correspond to the terminal portion 222 having different connector forms under a power output of different wattages.

Therefore, regarding the foregoing assembly and connection of the power core unit 100 having different parameters, in response to power requirements, the terminal portion 222 may be correspondingly replaced to adaptively satisfy back-end applications of portable electronic devices or industrial computers in high wattages, intermediate wattages or other wattages. Thus, the additional function device 1 according to the embodiment offers diversified applications, achieves efficient resource utilization, and provides a modularized form facilitating optimization of product supply for a manufacturer and requirements of users.

Figure 3:
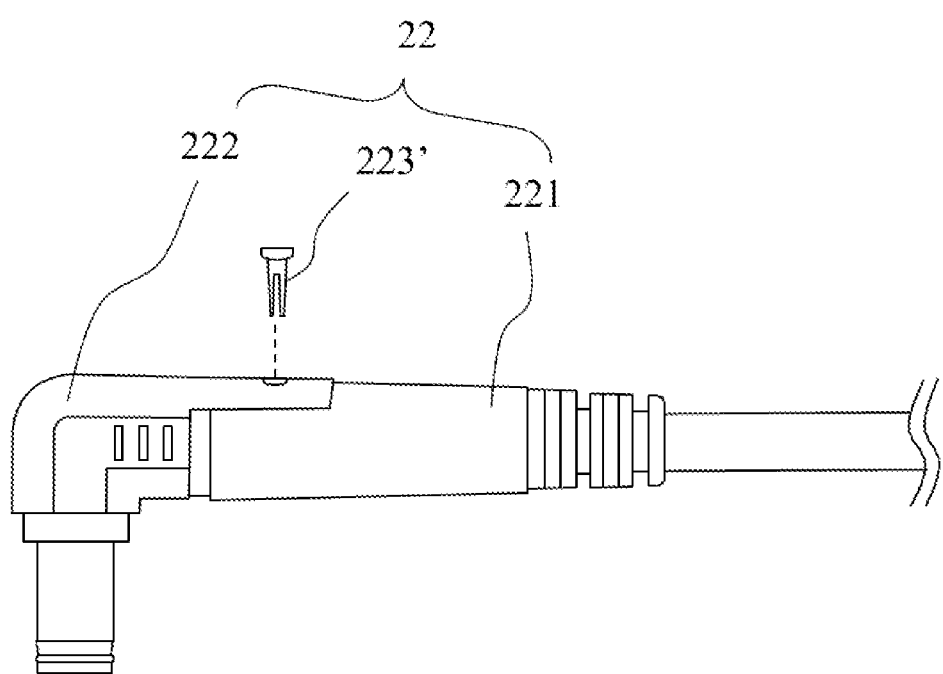
FIG. 3 shows another connection schematic diagram of the other end of the connecting line of the first embodiment of the present invention.

The fixing element 223 is for mutually limiting positions of the connection port terminal 221 and the terminal portion 222, and to accordingly fasten and join the two. Referring to the example shown in FIG. 2, the fixing element 223 may be, for example but not limited to, a screw. As shown in FIG. 3, a fixing element 223' may also be a rivet.

Figure 4:
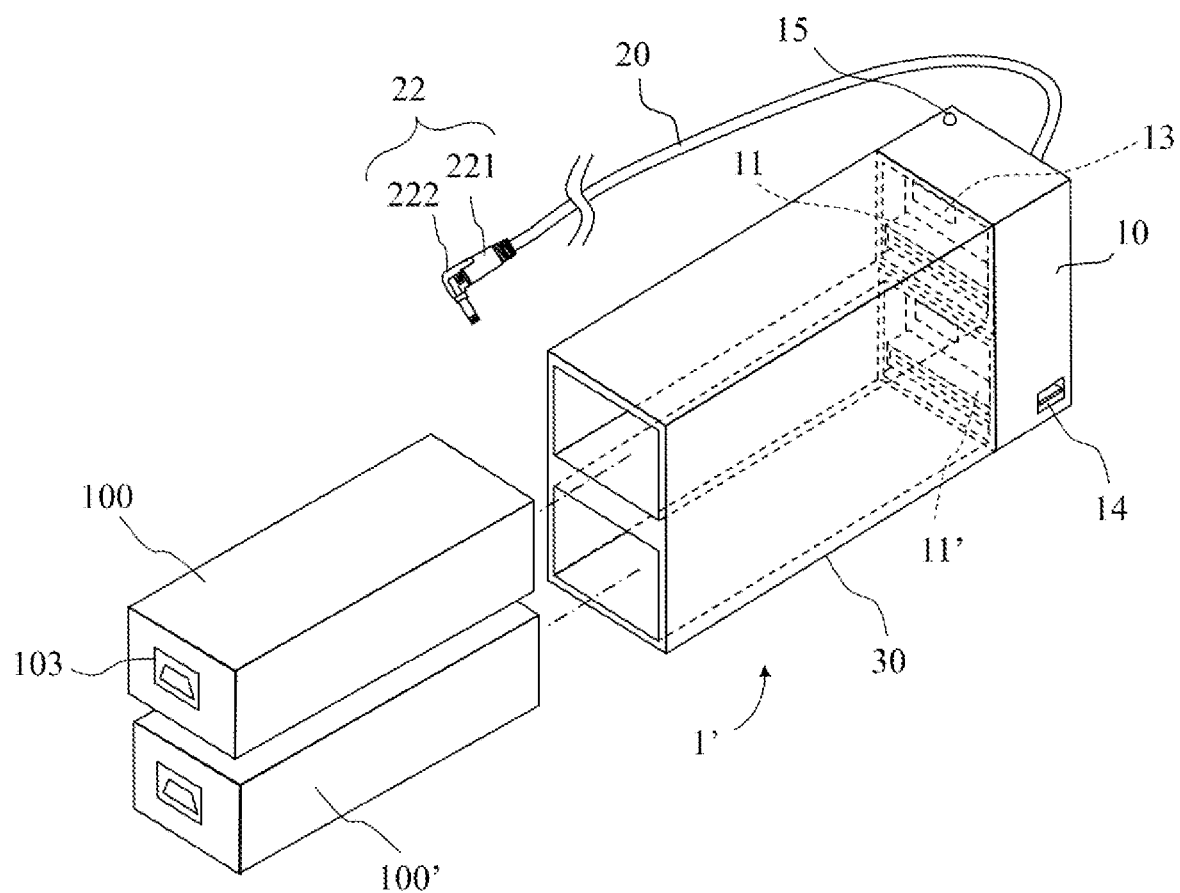
FIG. 4 shows a structural schematic diagram of an additional function device according to a second embodiment of the present invention.

FIG. 4 shows a structural schematic diagram of an additional function device according to a second embodiment of the present invention.

In an additional function device 1' according to the second embodiment of the present invention, the converter 10 further includes another input port 11' for assembling and connecting to another power core unit 100'. More specifically, the second embodiment differs from the first embodiment in that, the additional function device 1' can be assembled and connected, using the additional input port 11', to two or more power core units 100'. Each of the power core units 100 and 100' includes a connection port 103 for coupling to a power line.

In this embodiment, the converter 10 may include a digital control module 16, which is coupled to the load and the power core units 100 and 100'. A power parameter may be modulated and controlled through communication of the digital control module 16 with the load and the power core units 100 and 100'.

Figure 5:
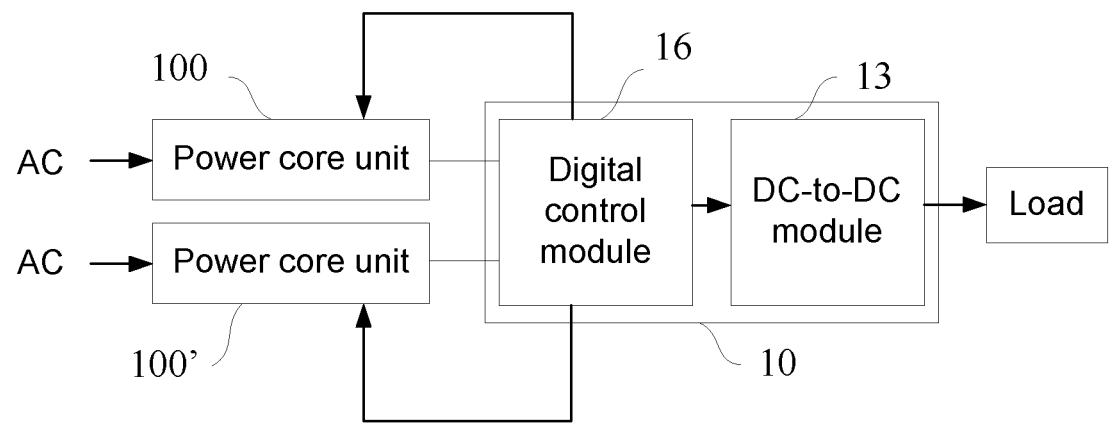
FIG. 5 shows a block diagram of an additional function device according to a second embodiment of the present invention.

Referring to FIG. 5 for illustration of an exemplary implementation aspect, the power core units 100 and 100' coupling to an AC power supply (an external power supply or a mains electricity power supply) may be connected in series through the connection port 103, and the power of the transmission power of the additional function device 1 can be, with the modulation and control of the digital control module 16, as a sum of the output powers of the power core units 100 and 100', thereby satisfying requirements for a back-end load having different wattages. For example, assuming that the output powers of the power core units 100 and 100' are respectively 45 watts, after the modulation and control of the digital control module 16, a combined power of the transmission power from the additional function device 1 is 90 watts.

The digital control module 16 may have a current equalizing function for modulating and controlling values of currents outputted from the power core units 100 and 100'. Further, according to communication between a communication module (not shown) and a load, a current value needed by the load is acquired for the digital control module 16 to modulate and control the output currents from the power core units 100 and 100'. As such, the current needed by the load can be evenly distributed; that is, the needed output value from the power core units 100 and 100' is evenly distributed. The communication module mentioned above may be a power management bus (PMBus) module or other communication modules so as to acquire information of the current value needed by the load.

Again to FIG. 5 for illustration of another exemplary implementation aspect, the digital control module 16 enables the configuration of the power core units 100 and 100' as a redundant power conversion structure to further enhance powering stability of an external power supply module. The power core units 100 and 100' are respectively used as a main power converter and an auxiliary power converter. When the digital control module 16 determines that the output from the power core unit 100 serving as the main power converter satisfies a normal powering condition (e.g., an operating voltage interval), the DC-to-DC module 13 of the converter 10 is controlled by the digital control module 16 to perform power conversion according to the output of the power core unit 100, and the power core unit 100' serving as the auxiliary power converter is controlled by the digital control module 16 to stop operating or enter hibernation.

Conversely, when the digital control module 16 determines that the power core unit 100 serving as the main power converter does not satisfy a normal powering condition, the power core unit 100' serving as the auxiliary power converter is controlled by the digital control module 16 to perform power conversion according to the output from the power core unit 100', and the power core unit 100 serving as the main power converter is controlled by the digital control module 16 to stop operating or enter hibernation.

Again referring to FIG. 4, the additional function device 1 may further include a housing 30 combined with the converter 10. The housing 30 receives the power core units 100 and 100', such that the power core units 100 and 100' can be assembled and connected in the housing 30.

Figure 6:
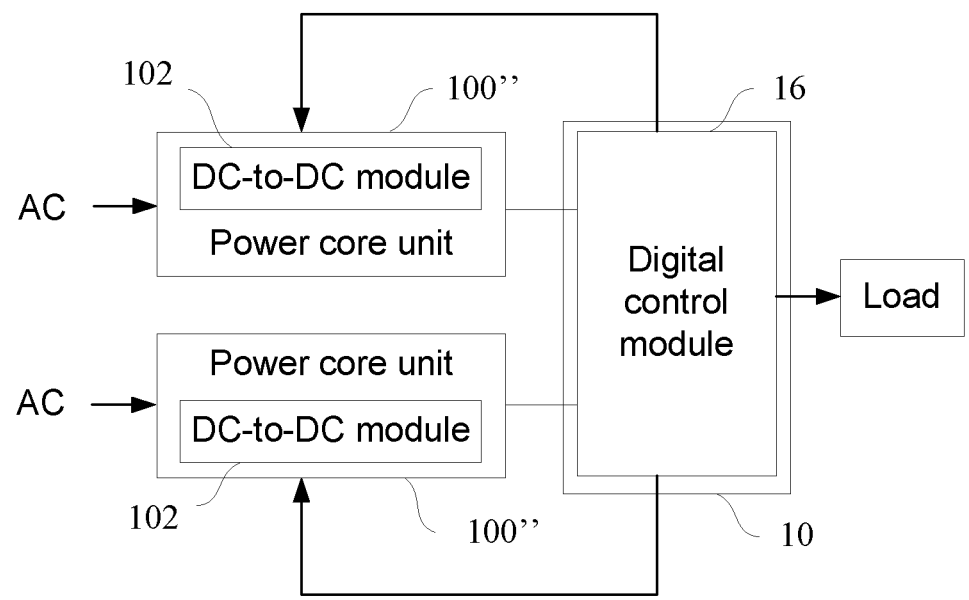
FIG. 6 shows a block diagram of an additional function device according to a third embodiment of the present invention.

FIG. 6 shows a block diagram of an additional function device according to a third embodiment of the present invention. In the third embodiment of the present invention, a difference from the foregoing embodiments is that, a power core unit 100" is directly built-in with a DC-to-DC module 102, with the remaining parts being identical to those in the foregoing embodiments and having the same applications.

When each power core unit 100" is directly built-in with the DC-to-DC module 102, each DC-to-DC module 102 is for converting the high-voltage DC power outputted from the power core unit 100" to a DC output power in a rated voltage and current. In such aspect, the converter 10 no longer needs the foregoing DC-to-DC module 13, and is not required to be provided with the DC-to-DC module 13.

In conclusion, the additional function device of an external power supply module disclosed by the embodiments of the present invention provides diversified matching capabilities, enabling the additional function device of the external power supply module to be effectively utilized and reducing resource waste.

While the invention has been described by way of example and in terms of the preferred embodiments, one person skilled in the art can understand that the embodiments are for explaining the present invention, but are not to be construed as limitations to the present invention. It is to be noted that, equivalent modifications and arrangements made based on the embodiments are covered within and the scope of the present invention. Therefore, the scope of the present invention should be accorded by the broadest interpretation of the appended claims of the application.

What is claimed is:

1. An additional function device of an external power supply module, for connecting to a first power core unit with a first parameter or a second power core unit with a second parameter, wherein the first parameter is different from the second parameter, the additional function device comprising:
    a converter, comprising:
        an input port having a first trace channel and a second trace channel, the first trace channel different from the second trace channel, the input port detachably assembling and connecting to the first power core unit or the second power core unit and acquiring a transmission power converted by the first power core unit or the second power core unit, the first trace channel corresponding to the first power core unit and the second trace channel corresponding to the second power core unit; and
        an output terminal; and
    a connecting line, comprising:
        a first end coupled to an output terminal of the converter to transmit the transmission power; and
        a second end for connecting to a load to output the transmission power to the load.

2. The additional function device according to claim 1, wherein the converter comprises a DC-to-DC module.

3. The additional function device according to claim 2, wherein the converter comprises a USB connection port coupled to the DC-to-DC module.

4. The additional function device according to claim 1, wherein the converter comprises a power display light assembly for indicating when the first power core unit provides power.

5. The additional function device according to claim 1, wherein the second end of the connecting line comprises a connection port terminal and a terminal portion, and the connection port terminal and the terminal portion are fixedly connected by a fixing element.

6. The additional function device according to claim 5, wherein the fixing element is a rivet or a screw.

7. The additional function device according to claim 1, wherein the first power core unit comprises a plurality of terminals, the input port and the plurality of terminals form a mutually docked male/female connector assembly.

8. The additional function device according to claim 1, wherein the converter further comprises another input port for assembling and connecting to another power core unit.

9. The additional function device according to claim 8, wherein the converter comprises a digital control module coupling the load and the power core units, and a power parameter is modulated and controlled through communication of the load with the power core units.

10. The additional function device according to claim 9, further comprising a housing combined with the converter, wherein the housing is for receiving the power core units.

11. The additional function device according to claim 1, wherein the converter comprises a USB connection port, and the USB connection port is for coupling to a DC-to-DC module built in the power core unit after the converter is coupled to the power core unit.

12. The additional function device according to claim 11, wherein the converter comprises a power display light assembly for indicating when the power core unit provides power after the converter is coupled to the power core unit.

13. The additional function device according to claim 11, wherein the other end of the connecting line comprises a connection port terminal and a terminal portion, and the connection port terminal and the terminal portion are fixedly connected by a fixing element.

14. The additional function device according to claim 13, wherein the fixing element is a rivet or a screw.

15. The additional function device according to claim 11, further comprising another input port for assembling and connecting to another power core unit.

16. The additional function device according to claim 15, wherein the converter comprises a digital control module coupling the load and the power core units, and a power parameter is modulated and controlled through communication of the load with the power core units.

17. The additional function device according to claim 16, further comprising a housing combined with the converter, and the housing is for receiving the power core units.

18. The additional function device according to claim 1, wherein the input port is rectangular.

* * * * *